(12) United States Patent
McNair et al.

(10) Patent No.: US 11,238,200 B2
(45) Date of Patent: Feb. 1, 2022

(54) TARGETING SYSTEM AND SIMULATOR THEREFOR

(71) Applicant: Bell Helicopter Textron Inc., Fort Worth, TX (US)

(72) Inventors: Michael McNair, Fort Worth, TX (US); Brent Chadwick Ross, Flower Mound, TX (US); Christopher Stroncek, Fort Worth, TX (US); Kip Gregory Campbell, Hurst, TX (US); Joseph Scott Drennan, Dallas, TX (US); Brett Zimmerman, Hurst, TX (US); Carey Cannon, Colleyville, TX (US)

(73) Assignee: Textron Innovations Inc., Providence, RI (US)

( * ) Notice: Subject to any disclaimer, the term of this patent is extended or adjusted under 35 U.S.C. 154(b) by 328 days.

(21) Appl. No.: 16/293,425

(22) Filed: Mar. 5, 2019

(65) Prior Publication Data

US 2020/0026811 A1    Jan. 23, 2020

Related U.S. Application Data

(60) Provisional application No. 62/638,870, filed on Mar. 5, 2018.

(51) Int. Cl.
*G06F 30/33* (2020.01)
*H01R 13/66* (2006.01)
(Continued)

(52) U.S. Cl.
CPC .............. *G06F 30/33* (2020.01); *G06F 30/15* (2020.01); *G06F 30/367* (2020.01);
(Continued)

(58) Field of Classification Search
CPC . G09B 9/00; G09B 19/16; G09B 9/12; G09B 9/42; G06F 30/15
See application file for complete search history.

(56) References Cited

U.S. PATENT DOCUMENTS 8,498,758 B1 * 7/2013 Bell ........................ G01C 5/005
701/4
9,230,446 B1 * 1/2016 Mendro ................. G09B 9/003
(Continued)

*Primary Examiner* — Kibrom K Gebresilassie
(74) *Attorney, Agent, or Firm* — Lightfoot & Alford PLLC

(57) ABSTRACT

A method of operating a targeting system simulation tool (TSST) includes providing a TSST configured to receive an obstacle/effect parameterization, a simulation parameterization, a sensor parameterization, an aircraft parameterization, and an autonomy parameterization. The method further includes receiving by the TSST, at least one of each of an obstacle/effect parameterization and a simulation parameterization. The method further includes receiving by the TSST, either (1) a sensor parameterization or (2) an aircraft parameterization. The method further includes operating the TSST to apply the provided ones of the obstacle/effect parameterization, simulation parameterization, sensor parameterization, and aircraft parameterization to generate a value, value range, or value limit for the unprovided aircraft parameterization or unprovided sensor parameterization.

19 Claims, 7 Drawing Sheets

(51) Int. Cl.
  *G06F 30/15*   (2020.01)
  *G06F 30/367*  (2020.01)
  *G09B 9/42*   (2006.01)
  *G09B 9/00*   (2006.01)
  *G09B 9/12*   (2006.01)
  *G09B 19/16*  (2006.01)

(52) U.S. Cl.
  CPC ........... *H01R 13/6683* (2013.01); *G09B 9/00* (2013.01); *G09B 9/12* (2013.01); *G09B 9/42* (2013.01); *G09B 19/16* (2013.01)

(56) References Cited

U.S. PATENT DOCUMENTS

| | | | | |
|---|---|---|---|---|
| 9,489,575 B1* | 11/2016 | Whalen | .................... | G01S 7/411 |
| 9,997,078 B2* | 6/2018 | Gadgil | ................. | G08G 5/0052 |
| 10,267,889 B1* | 4/2019 | Ihns | ...................... | G01S 3/7835 |
| 2008/0243383 A1* | 10/2008 | Lin | ...................... | G08G 5/0078 |
| | | | | 701/469 |
| 2012/0221305 A1* | 8/2012 | Srivastav | ............. | G08G 5/0034 |
| | | | | 703/6 |
| 2012/0310450 A1* | 12/2012 | Srivastav | ................. | G09B 9/08 |
| | | | | 701/3 |
| 2013/0339415 A1* | 12/2013 | Krogh | ..................... | G01S 19/47 |
| | | | | 708/316 |
| 2015/0194059 A1* | 7/2015 | Starr | .................... | G08G 5/0017 |
| | | | | 701/3 |
| 2016/0052641 A1* | 2/2016 | Olofinboba | .......... | G08G 5/0078 |
| | | | | 340/978 |
| 2016/0055275 A1* | 2/2016 | Wang | ..................... | G06Q 10/06 |
| | | | | 703/8 |
| 2016/0202874 A1* | 7/2016 | Lizer | ..................... | G06F 40/143 |
| | | | | 715/738 |
| 2016/0275801 A1* | 9/2016 | Kopardekar | ......... | G08G 5/0069 |
| 2017/0010611 A1* | 1/2017 | Tao | ....................... | G05D 1/0094 |
| 2017/0200378 A1* | 7/2017 | Smothers | ............ | G08G 5/0043 |
| 2017/0236439 A1* | 8/2017 | Bowness | ................. | G09B 5/14 |
| | | | | 434/362 |
| 2018/0136646 A1* | 5/2018 | Gurdan | .................. | G09F 21/06 |
| 2018/0315323 A1* | 11/2018 | Winkler | ............... | G08G 5/0095 |
| 2019/0027051 A1* | 1/2019 | Veronesi | ................ | G08G 5/06 |
| 2019/0304326 A1* | 10/2019 | Nadeau Beaulieu | .... | G09B 9/44 |
| 2020/0159225 A1* | 5/2020 | Zeng | ...................... | G05D 1/0088 |
| 2020/0193849 A1* | 6/2020 | Spinelli | ................. | G08G 5/025 |

* cited by examiner

TARGETING SYSTEM AND SIMULATOR THEREFOR

CROSS-REFERENCE TO RELATED APPLICATIONS

This patent application claims the benefit of the filing date of the U.S. Provisional Patent Application Ser. No. 62/638,870, filed on 5 Mar. 2018 and entitled "TARGETING SYSTEM AND SIMULATOR THEREFOR," the entire content of which is hereby expressly incorporated by reference.

STATEMENT REGARDING FEDERALLY SPONSORED RESEARCH OR DEVELOPMENT

Not applicable.

REFERENCE TO A MICROFICHE APPENDIX

Not applicable

BACKGROUND

The effectiveness of some existing airborne targeting systems is hampered by undesirable weather conditions, changes in available ambient light (such as daytime operations versus nighttime operations), or hostile environments. While weather and light conditions can directly affect a targeting system capability to acquire or utilize environmental information, hostile environments can both directly affect such capabilities as well as result in operational decisions to discontinue missions, such as when sufficient threat of incoming ballistic impacts make continued operation of an airborne system unadvisable due to likelihood of loss of the airborne system. There exists a need for a targeting system configured to provide improved long-range precision target identification and target location that can operate at low altitudes and at fast airspeeds in any weather at any time. There also exists a need for a simulator configured to simulate the above-described targeting systems for both design of the targeting system and subsequent targeting system operation planning and operational control.

DETAILED DESCRIPTION

Figure 1:
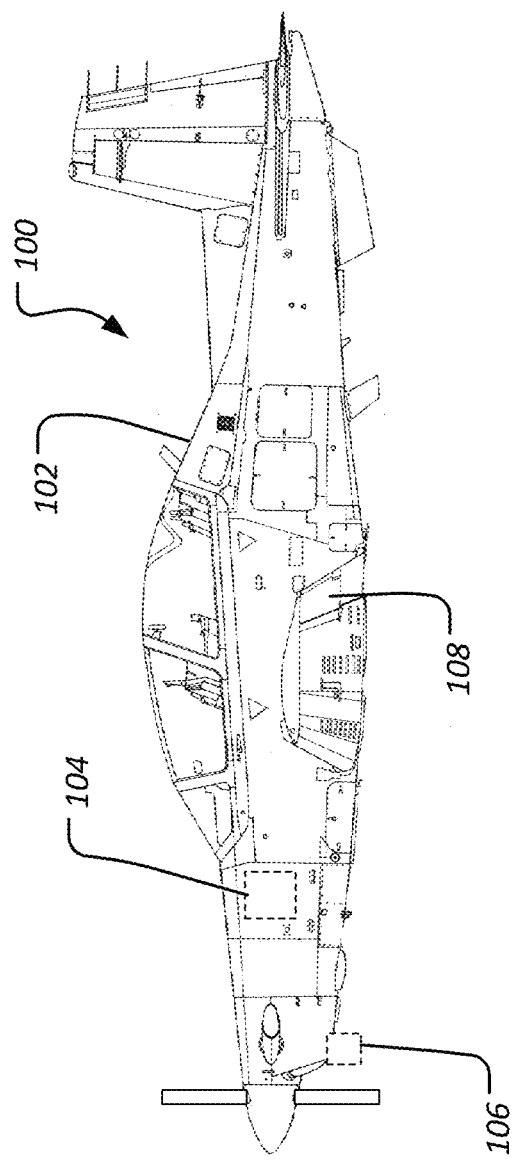
FIG. 1 is a side view of a targeting system according to an embodiment of this disclosure.
Figure 2:
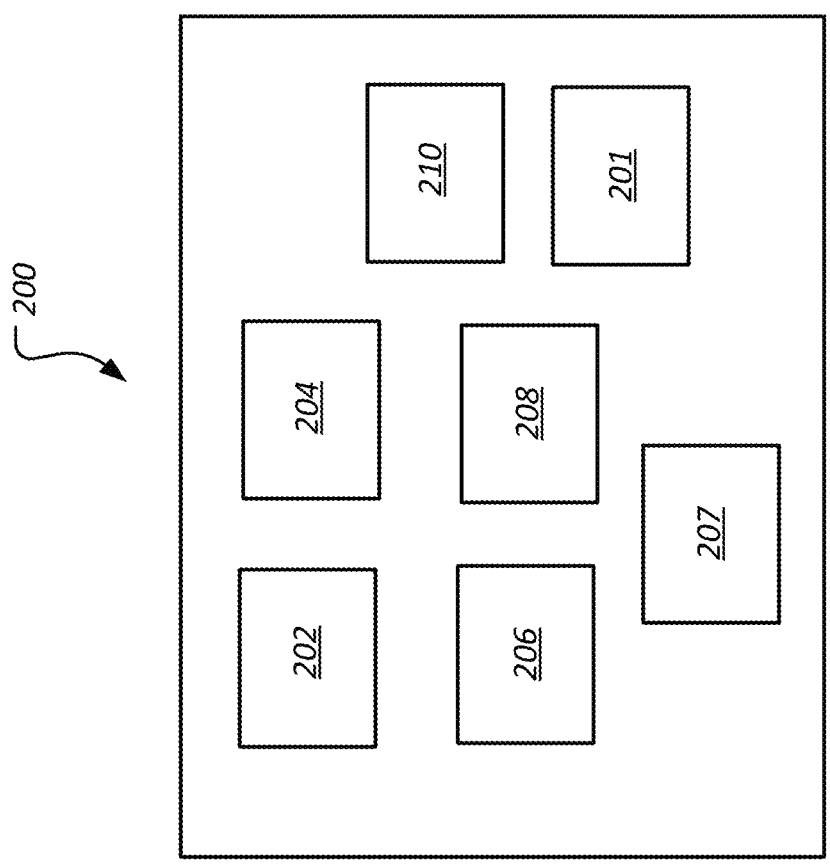
FIG. 2 is a schematic view of a targeting system simulation tool (TSST) according to an embodiment of this disclosure.

In the specification, reference may be made to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

A targeting system 100 comprises an aircraft 102, a targeting processor 104 configured to receive information from sensors 106 and configured to alter control of aircraft 102 using one or more active controls 108. The aircraft 102 can comprise an airplane, such as, but not limited to a Beechcraft T-6 Texan type training aircraft, although any other aircraft can alternatively be utilized, including, but not limited to, jets, helicopters, tiltrotors, unmanned aerial vehicles, rockets, drones, or any other suitable aircraft. The targeting system 100 provides a long-range precision target identification/location system that operates "low and fast" in all weather, day or night, to provide near peer penetration without the need for on-board countermeasures. The targeting system 100 is configured to utilize combinations of autonomous decision making, sensor systems, and vehicle performance factors to maximize survivability of the targeting system 100 in the "low and fast" environment.

A targeting system simulation tool (TSST) 200 is also disclosed. The TSST 200 comprises a simulation processor 201. The TSST 200 is configured to, independently or with the assistance of a user, trade autonomy, sensor data, and aircraft performance/maneuver traits to maximize determined desired operational settings for operating the targeting system 100 in a manner that maximizes survivability of the targeting system 100 in a "low and fast" environment.

The targeting system 100 is configured to provide at least three discriminating operational characteristics: autonomous operation, terrain and feature updates, and threat mapping. In support of these characteristics and the operational mission, the TSST 200 is configured to analyze aircraft and performance trade-offs. The TSST 200 allows the user the ability to explore inter-relationships and dependencies between gross level aircraft characteristics (altitude, airspeed, maneuverability, etc.) with sensor performance (range, object cross-section, etc.) and navigation (including obstacle detection and avoidance, map-based navigation, etc.), all under fully autonomous aircraft control. The TSST 200 can provide the basis for identifying and defining aircraft design envelopes and operational behaviors suitable for meeting the above-described characteristics and operational mission.

The TSST 200 is configured to provide an ability to investigate the relationship between aircraft, obstacle/effects, and sensing in both teleoperated operations and autonomous operations. The TSST is configured to support analysis through parameterization of these and other factors and specifically supports investigation into what sensing is needed given a defined aircraft performance, what aircraft performance is needed given a defined set of sensors, and what the anticipated likelihood of a collision along an established course with a feature is.

While the Beechcraft T-6 Texan is listed above as one suitable aircraft for use in targeting system 100 and for use in modeling a targeting system 100 using TSST 200, any other similar or suitable aircraft can provide adequate model fidelity to develop initial targeting system 100 design criteria. The aircraft model includes gross characteristics of weight, size, lift, drag, propulsion, maneuverability and other factors necessary for computing aircraft trajectory. Simple control laws can be provided in support of the desired simulation fidelity. The aircraft flight path and course decision making can be fully visualized in three dimensions for compelling trade study presentation, with the terrain and obstacles being shown from each of a so-called "god's eye" perspective and aircraft perspectives with fast forward, rewind, and pause capability.

In some embodiments, a primary tool framework can be provided using MatLab with MatLab's built-in facility for user interface design and simulation. Additional interfaces to applications like Unity and OpenCV can be utilized, as desired, for two-dimensional and three-dimensional graphical map interface and visualization. The TSST 200 can be structured to allow integration of "plug-ins" that allow development and utilization of targeting systems that utilize specific instances of aircraft, effects, and sensor parameterizations, thereby allowing faster and convenient targeting system designs around a variety of aircraft types, sensor types, system responses, and effects. The plug-ins can be used to tailor a TSST 200 beyond basic functionality.

In some cases, a method of developing a targeting system can comprise an exercise of manipulating the parameterizations of the provided plug-ins. For example, to determine what sensing is needed given a defined aircraft performance, an aircraft plug-in instance can be created and left unmodified during a simulation using the TSST 200 while modifying the parameters of the sensor and obstacle/effect instances. The resultant simulated navigation and behavior of the aircraft can be noted while being visualized in a mapping portion of the TSST 200. By adjusting the sensing and obstacle/effect instances, a desired set of aircraft performance characteristics can be identified.

Figure 3:
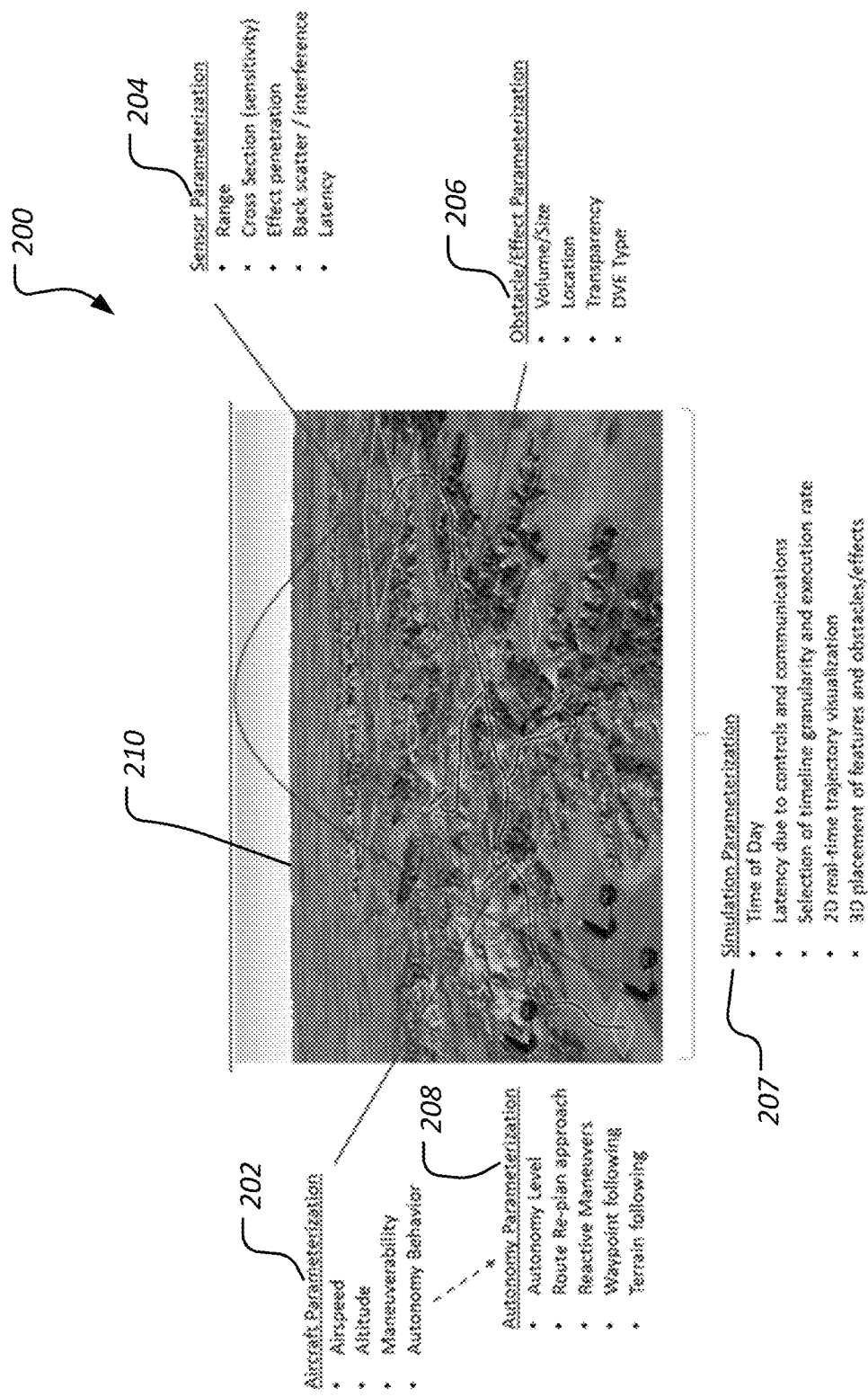
FIG. 3 is an explanatory graphic regarding operation of the TSST of FIG. 2.

Referring to FIG. 3, a diagram providing context, some key parameterizations, and controls for the TSST 200 are identified. The aircraft parameterization 202, sensor parameterization 204, and obstacle/effect parameterization 206 can be provided by associated plug-ins and integrated through the parameterizations shown in FIG. 3. Unique to the TSST 200 is the autonomous behaviors parameterization 208 to include level of autonomy, waypoint identification, and route planning approach. Combining autonomous navigation with the low altitude, high speed maneuverability of the aircraft, the TSST 200 supports investigation of reactive and adaptive responses. The three-dimensional map visualization 210 capability further adds to the realism by allowing multi-dimensional placement and viewing of obstacles and effects. Viewing a path from the platform, from above and other angles while supporting timeline control of moving forward and reverse through the simulation, which further adds to the functional and analytical benefit.

The TSST 200 also provides aircraft navigation planning functionality and route re-planning functionality. The aircraft navigation planning functionality can utilize a pre-populated, on-board three-dimensional map that includes terrain and feature information. The targeting system 100 can comprise this capability for use in route planning and obstacle avoidance. Further, the TSST 200 and the targeting system 100 can comprise functionality related to "pop-up" obstacle/effect, which can nominally be defined as a simulated object that is not in the a priori map feature database and is beyond a simulated sensing range along a planned route. The TSST 200 and the targeting system 100 can further comprise options for different re-planning paradigms (e.g., A*, 3D D*, and others) to simulate and/or control anticipated aircraft autonomous behavior.

Figure 4:
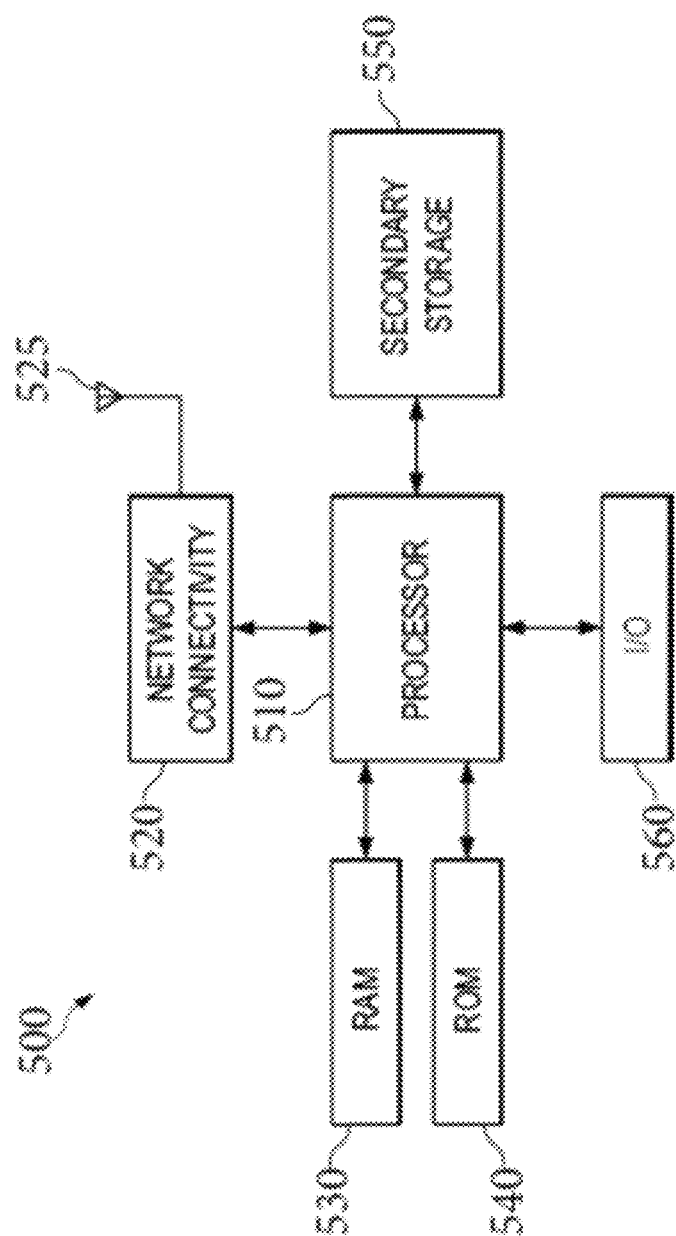
FIG. 4 shows a general-purpose processor system.

Referring now to FIG. 4, a simplified diagram of a general-purpose processor (e.g. electronic controller or computer) system 500 suitable for implementing the embodiments of this disclosure is shown. In particular, targeting processor 104 and simulation processor 201 can comprises one or more systems 500. System 500 that includes a processing component 510 is suitable for implementing one or more embodiments disclosed herein. In addition to the processor 510 (which may be referred to as a central processor unit or CPU), the system 500 might include network connectivity devices 520, random access memory (RAM) 530, read only memory (ROM) 540, secondary storage 550, and input/output (I/O) devices 560. In some cases, some of these components may not be present or may be combined in various combinations with one another or with other components not shown. These components might be located in a single physical entity or in more than one physical entity. Any actions described herein as being taken by the processor 510 might be taken by the processor 510 alone or by the processor 510 in conjunction with one or more components shown or not shown in the system 500. It will be appreciated that the data described herein can be stored in memory and/or in one or more databases.

The processor 510 executes instructions, codes, computer programs, or scripts that it might access from the network connectivity devices 520, RAM 530, ROM 540, or secondary storage 550 (which might include various disk-based systems such as hard disk, floppy disk, optical disk, or other drive). While only one processor 510 is shown, multiple processors may be present. Thus, while instructions may be discussed as being executed by processor 510, the instructions may be executed simultaneously, serially, or otherwise by one or multiple processors 510. The processor 510 may be implemented as one or more CPU chips and/or application specific integrated chips (ASICs).

The network connectivity devices 520 may take the form of modems, modem banks, Ethernet devices, universal serial bus (USB) interface devices, serial interfaces, token ring devices, fiber distributed data interface (FDDI) devices, wireless local area network (WLAN) devices, radio transceiver devices such as code division multiple access (CDMA) devices, global system for mobile communications (GSM) radio transceiver devices, worldwide interoperability for microwave access (WiMAX) devices, and/or other well-known devices for connecting to networks. These network connectivity devices 520 may enable the processor 510 to communicate with the Internet or one or more telecommunications networks or other networks from which the processor 510 might receive information or to which the processor 510 might output information.

The network connectivity devices 520 might also include one or more transceiver components 525 capable of transmitting and/or receiving data wirelessly in the form of electromagnetic waves, such as radio frequency signals or microwave frequency signals. Alternatively, the data may propagate in or on the surface of electrical conductors, in coaxial cables, in waveguides, in optical media such as optical fiber, or in other media. The transceiver component 525 might include separate receiving and transmitting units or a single transceiver. Information transmitted or received by the transceiver 525 may include data that has been processed by the processor 510 or instructions that are to be executed by processor 510. Such information may be received from and outputted to a network in the form, for example, of a computer data baseband signal or signal embodied in a carrier wave. The data may be ordered according to different sequences as may be desirable for either processing or generating the data or transmitting or receiving the data. The baseband signal, the signal embedded in the carrier wave, or other types of signals currently used or hereafter developed may be referred to as the transmission medium and may be generated according to several methods well known to one skilled in the art.

The RAM 530 might be used to store volatile data and perhaps to store instructions that are executed by the processor 510. The ROM 540 is a non-volatile memory device that typically has a smaller memory capacity than the memory capacity of the secondary storage 550. ROM 540 might be used to store instructions and perhaps data that are read during execution of the instructions. Access to both RAM 530 and ROM 540 is typically faster than to secondary storage 550. The secondary storage 550 is typically comprised of one or more disk drives or tape drives and might be used for non-volatile storage of data or as an over-flow data storage device if RAM 530 is not large enough to hold all working data. Secondary storage 550 may be used to store programs or instructions that are loaded into RAM 530 when such programs are selected for execution or information is needed.

The I/O devices 560 may include liquid crystal displays (LCDs), touchscreen displays, keyboards, keypads, switches, dials, mice, track balls, voice recognizers, card readers, paper tape readers, printers, video monitors, transducers, sensors, or other well-known input or output devices. Also, the transceiver 525 might be considered to be a component of the I/O devices 560 instead of or in addition to being a component of the network connectivity devices 520. Some or all of the I/O devices 560 may be substantially similar to various components disclosed.

In some cases, the aircraft parameterization 202 comprises airspeed, altitude, maneuverability, and autonomy behaviors. In some cases, the aircraft can be associated with autonomy parameterizations 208 that comprise an autonomy level, a rout re-plan approach, reactive maneuvers, waypoint following, and terrain following. In some cases, the obstacle/effect parameterization 206 can comprise volume/size, location, transparency, and DVE type. In some cases, the sensor parameterizations 204 can comprise range, cross-section (sensitivity), effect penetration, back scatter/interference, and latency. In some cases, the simulation parameterizations 207 comprise time of day, latency due to controls and communications, selection of timeline granularity and execution rate, 2D real-time trajectory visualization, and 3D placement of features and obstacles/effects.

Figure 5:
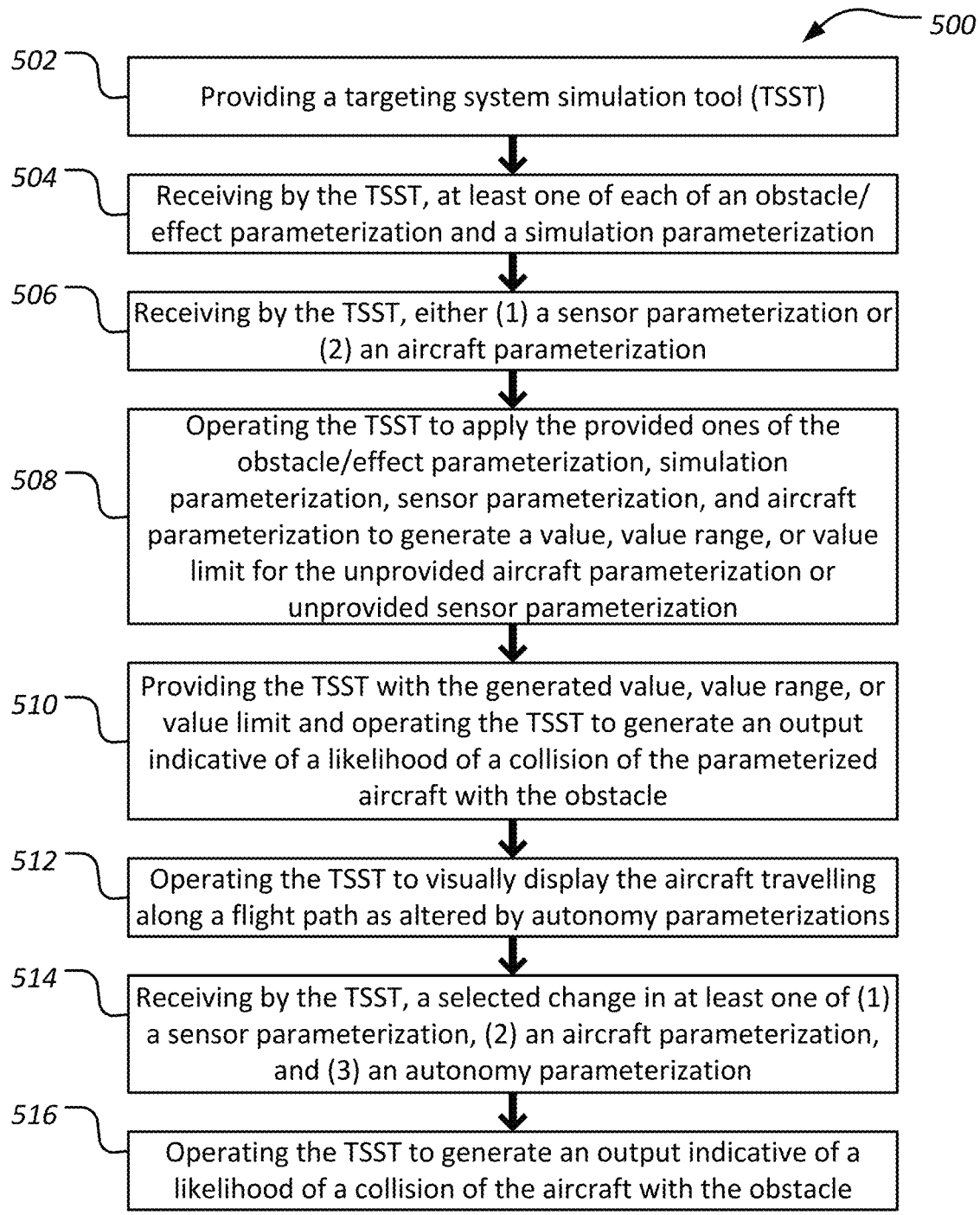
FIG. 5 shows a flowchart of a method of operating a TSST according to an embodiment of this disclosure.

Referring now to FIG. 5, a flowchart of a method 500 of operating a TSST 200 is shown. The method 500 may begin at block 502 by first providing a TSST 200. The method 500 may continue at block 504 by the TSST 200 receiving at least one of each of an obstacle/effect parameterization 206 and a simulation parameterization 207. The method 500 may continue at block 506 by the TSST 200 receiving either (1) a sensor parameterization 204 or (2) an aircraft parameterization 202. The method 500 may continue at block 508 by operating the TSST 200 to apply the provided ones of the obstacle/effect parameterization 206, simulation parameterization 207, sensor parameterization 204, and aircraft parameterization 202 to generate a value, value range, or value limit for the unprovided aircraft parameterization 202 or unprovided sensor parameterization 204. The method 500 may continue at block 510 by providing the TSST 200 with the generated value, value range, or value limit and operating the TSST 200 to generate an output indicative of a likelihood of a collision of the parameterized aircraft with an obstacle. The method 500 may continue at block 512 by operating the TSST 200 to visually display the parameterized aircraft travelling along a flight path as altered by autonomy parameterizations 208. The method 500 may continue at block 514 by the TSST 200 receiving a selected change (selected by a user or selected by the TSST 200) in at least one of (1) a sensor parameterization 204, (2) an aircraft parameterization 202, and (3) an autonomy parameterization. The method 500 may continue at block 516 by operating the TSST 200 to generate an output indicative of a likelihood of a collision of the aircraft with the obstacle.

Figure 6:
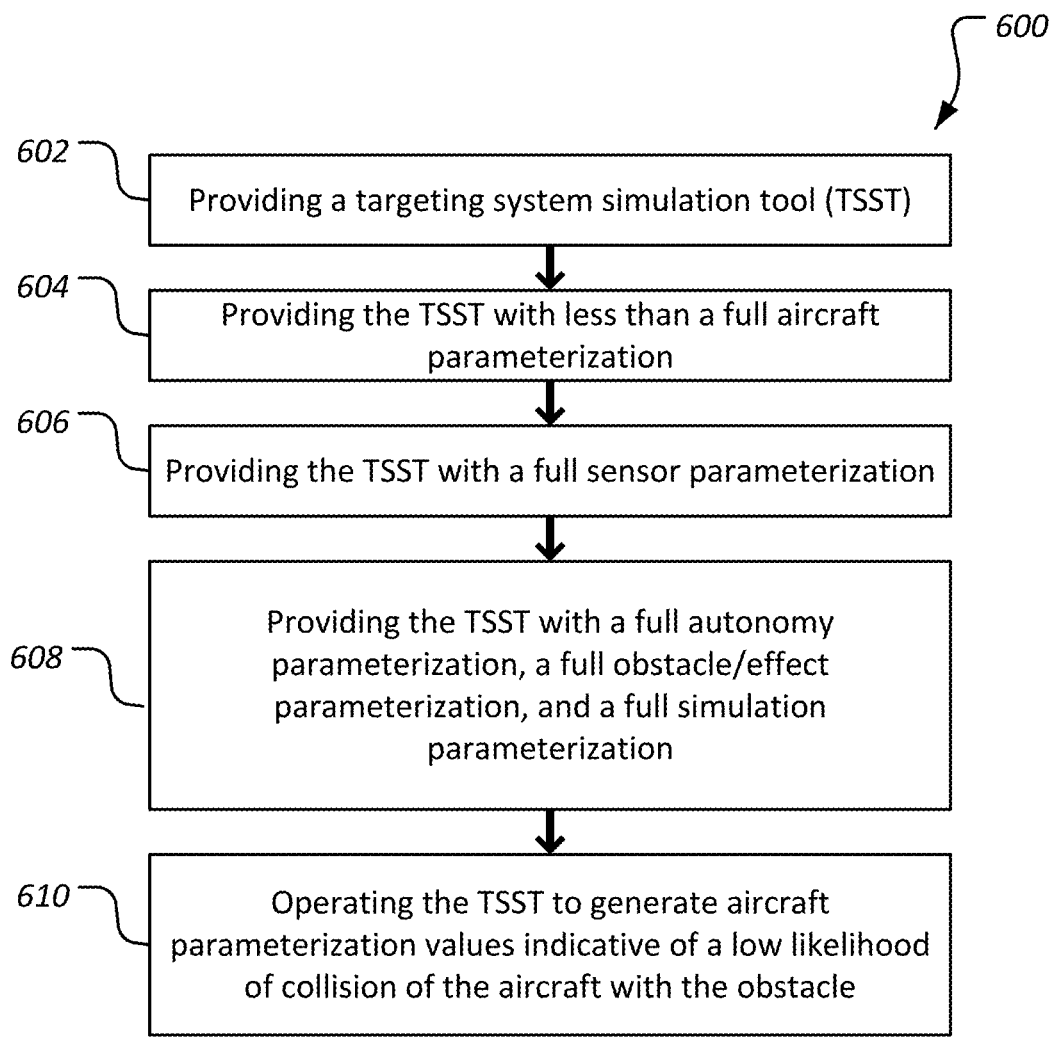
FIG. 6 shows a flowchart of another method of operating a TSST according to an embodiment of this disclosure.

Referring now to FIG. 6, a flowchart of a method 600 of operating a TSST 200 is shown. The method 600 may begin at block 602 by providing a TSST 200. The method 600 may continue at block 604 by providing the TSST 200 with less than a full aircraft parameterization 202. The method 600 may continue at block 606 by providing the TSST 200 with a full sensor parameterization 204. The method 600 may continue at block 608 by providing the TSST 200 with a full autonomy parameterization 208, a full obstacle/effect parameterization 206, and a full simulation parameterization 207. The method 600 may continue at block 610 by operating the TSST 200 to generate aircraft parameterization 202 values indicative of a low likelihood of collision of the aircraft with the obstacle.

Figure 7:
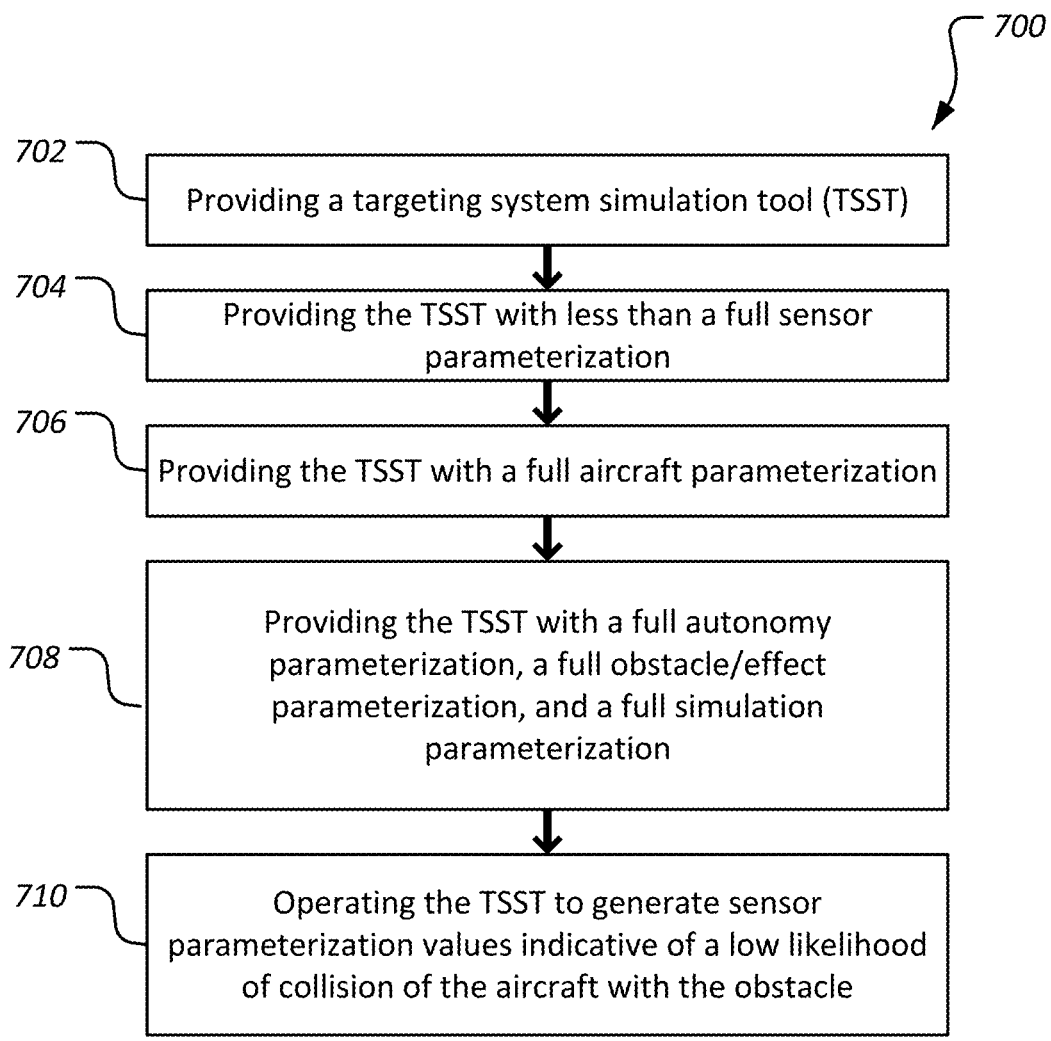
FIG. 7 shows a flowchart of another method of operating a TSST according to an embodiment of this disclosure.

Referring now to FIG. 7, a flowchart of a method 700 of operating a TSST 200 is shown. The method 700 may begin at block 702 by providing a TSST 200. The method 700 may continue at block 704 by providing the TSST 200 with less than a full sensor parameterization 204. The method 700 may continue at block 706 by providing the TSST 200 with a full aircraft parameterization 202. The method 700 may continue at block 708 by providing the TSST 200 with a full autonomy parameterization 208, a full obstacle/effect parameterization 206, and a full simulation parameterization 207. The method 700 may continue at block 710 by operating the TSST 200 to generate sensor parameterization 204 values indicative of a low likelihood of collision of the aircraft with the obstacle.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: R=Rl+k*(Ru−Rl), wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention.

What is claimed is:

1. A method of operating a targeting system simulation tool (TSST), comprising:
   providing a TSST configured to receive an obstacle/effect parameterization, a simulation parameterization, a sensor parameterization, an aircraft parameterization, and an autonomy parameterization;
   receiving by the TSST, at least one of each of an obstacle/effect parameterization and a simulation parameterization;
   receiving by the TSST, either (1) a sensor parameterization or (2) an aircraft parameterization; and
   providing a first value, value range, or value limit for at least one of the aircraft parameterization and the sensor parameterization associated with a first survivability value, operating the TSST to apply the provided ones of the obstacle/effect parameterization, simulation parameterization, sensor parameterization, and aircraft parameterization to generate a second value, value range, or value limit for the at least one of the aircraft parameterization and the sensor parameterization associated with a second survivability value that indicates a relatively higher survivability as compared to the first survivability value; and
   operating the TSST to visually display the aircraft travelling along a three dimensional flight path as altered by autonomy parameterizations and using at least one of the first value, value range, or value limit and the second value, value range, or value limit.

2. The method of claim 1, further comprising:
   providing the TSST with the generated value, value range, or value limit and operating the TSST to generate an output indicative of a likelihood of a collision of the parameterized aircraft with the obstacle.

3. The method of claim 1, further comprising:
   receiving by the TSST, a selected change in at least one of (1) a sensor parameterization, (2) an aircraft parameterization, and (3) an autonomy parameterization.

4. The method of claim 3, further comprising:
   operating the TSST to generate an output indicative of a likelihood of a collision of the aircraft with the obstacle.

5. The method of claim 1, wherein the aircraft parameterization comprises at least one of comprises airspeed, altitude, maneuverability, and autonomy behaviors.

6. The method of claim 1, wherein the sensor parameterization comprises at least one of range, cross-section, sensitivity, effect penetration, back scatter/interference, and latency.

7. The method of claim 1, wherein the autonomy parameterization comprises at least one of autonomy level, a rout re-plan approach, reactive maneuvers, waypoint following, and terrain following.

8. The method of claim 1, wherein the obstacle/effect parameterization comprises at least one of volume, size, location, transparency, and DVE type.

9. The method of claim 1, wherein the simulation parameterization comprises at least one of time of day, latency due to controls and communications, selection of timeline granularity and execution rate, 2D real-time trajectory visualization, and 3D placement of features and obstacles/effects.

10. A method of operating a targeting system simulation tool (TSST), comprising:
    providing a TSST;
    providing the TSST with a first value, value range, or value limit for an aircraft parameterization;
    providing the TSST with a sensor parameterization;
    providing the TSST with an autonomy parameterization, an obstacle/effect parameterization, and a simulation parameterization; and
    operating the TSST to generate a second value, value range, or value limit for the aircraft parameterization, the second value, value range, or value limit enabling a lower likelihood of collision between an aircraft and an obstacle as compared to the first value, value range, or value limit; and
    operating the TSST to visually display the aircraft travelling along a three dimensional flight path as altered by the autonomy parameterization and using at least one of the first value, value range, or value limit and the second value, value range, or value limit for the aircraft parameterization.

11. The method of claim 10, wherein the aircraft parameterization comprises at least one of comprises airspeed, altitude, maneuverability, and autonomy behaviors.

12. The method of claim 10, wherein the sensor parameterization comprises at least one of range, cross-section, sensitivity, effect penetration, back scatter/interference, and latency.

13. The method of claim 10, wherein the autonomy parameterization comprises at least one of autonomy level, a rout re-plan approach, reactive maneuvers, waypoint following, and terrain following.

14. The method of claim 10, wherein the obstacle/effect parameterization comprises at least one of volume, size, location, transparency, and DVE type.

15. The method of claim 10, wherein the simulation parameterization comprises at least one of time of day, latency due to controls and communications, selection of timeline granularity and execution rate, 2D real-time trajectory visualization, and 3D placement of features and obstacles/effects.

16. A method of operating a targeting system simulation tool (TSST), comprising:
    providing a TSST;
    providing the TSST with a first value, value range, or value limit for a sensor parameterization;
    providing the TSST with an aircraft parameterization;
    providing the TSST with an autonomy parameterization, an obstacle/effect parameterization, and a simulation parameterization; and
    operating the TSST to generate a second value, value range, or value limit for the sensor parameterization, the second value, value range, or value limit enabling a lower likelihood of collision between an aircraft and an obstacle as compared to the first value, value range, or value limit; and
    operating the TSST to visually display the aircraft travelling along a three dimensional flight path as altered by the autonomy parameterization and using at least one of the first value, value range, or value limit and the second value, value range, or value limit for the sensor parameterization.

17. The method of claim 16, wherein the aircraft parameterization comprises at least one of comprises airspeed, altitude, maneuverability, and autonomy behaviors.

18. The method of claim 16, wherein the sensor parameterization comprises at least one of range, cross-section, sensitivity, effect penetration, back scatter/interference, and latency.

19. The method of claim 16, wherein the simulation parameterization comprises at least one of time of day, latency due to controls and communications, selection of timeline granularity and execution rate, 2D real-time trajectory visualization, and 3D placement of features and obstacles/effects.

* * * * *